US007433180B2

(12) United States Patent
Ahn et al.

(10) Patent No.: US 7,433,180 B2
(45) Date of Patent: Oct. 7, 2008

(54) EXHAUST PIPE PROTECTING TIP AND PLASMA DISPLAY MODULE INCLUDING THE SAME

(75) Inventors: Joong-Ha Ahn, Suwon-si (KR); Dong-Hwan Kim, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 415 days.

(21) Appl. No.: 11/342,878

(22) Filed: Jan. 31, 2006

(65) Prior Publication Data

US 2006/0181210 A1 Aug. 17, 2006

(30) Foreign Application Priority Data

Feb. 5, 2005 (KR) ...................... 10-2005-0010966

(51) Int. Cl.
*G06F 1/16* (2006.01)
*H05K 5/00* (2006.01)
*H05K 7/00* (2006.01)

(52) U.S. Cl. ....................................... 361/681; 313/582

(58) Field of Classification Search ................. 361/681; 313/581, 582

See application file for complete search history.

(56) References Cited

U.S. PATENT DOCUMENTS 6,313,579 B1 * 11/2001 Nakano et al. .............. 313/493
2005/0067956 A1 3/2005 Kim ........................... 313/582
2006/0154008 A1 * 7/2006 Suzuki et al. .............. 428/34.4

FOREIGN PATENT DOCUMENTS

JP 2002-218617 8/2002
KR 1996-18929 6/1996
KR 2000-1763 1/2000

OTHER PUBLICATIONS

Search Report issued in European Patent Application No. 06100954.4 on Jul. 17, 2006.

* cited by examiner

*Primary Examiner*—Hae Moon Hyeon
(74) *Attorney, Agent, or Firm*—Stein, McEwen & Bui, LLP

(57) ABSTRACT

An exhaust pipe protecting tip which protects an exhaust pipe and is easy to fabricate due to separate fabrication of the exhaust protecting tip including a guide and attachment of the exhaust pipe protecting tip to an ear portion of a chassis, and a plasma display module including the exhaust pipe protecting tip. An exhaust pipe protecting tip for protecting an exhaust pipe of a plasma display module having a chassis with an ear portion and an exhaust hole for the exhaust pipe, the exhaust pipe protecting tip comprising a protecting portion being cylindrically-shaped to protect the exhaust pipe; a mounting portion formed on a side surface of the protecting portion, to fix the protecting portion to the ear portion of the chassis; and a guide protruding from an end of the protecting portion, to be inserted into the exhaust hole of the chassis.

17 Claims, 4 Drawing Sheets

EXHAUST PIPE PROTECTING TIP AND PLASMA DISPLAY MODULE INCLUDING THE SAME

CROSS-REFERENCE TO RELATED APPLICATIONS

This application claims the benefit of Korean Patent Application No. 2005-10966, filed on Feb. 5, 2005, in the Korean Intellectual Property Office, the disclosure of which is incorporated herein in its entirety by reference.

BACKGROUND OF THE INVENTION

1. Field of the Invention

Aspects of the present invention relate to an exhaust pipe protecting tip and a plasma display module including the exhaust pipe protecting tip, and more particularly, to an exhaust pipe protecting tip, which can protect the exhaust pipe and improves an ease of fabrication of the exhaust pipe protecting tip through separate fabrication of the exhaust pipe protecting tip having a guide and attaching the exhaust pipe protecting tip to an ear portion of a chassis, and a plasma display module including the exhaust pipe protecting tip.

2. Description of the Related Art

Plasma display panels (PDPs) that have begun to replace conventional cathode ray tubes (CRTs) are apparatuses for displaying images. In a plasma display panel, a discharge gas is sealed between two substrates having a plurality of electrodes, the discharge gas being supplied to generate ultraviolet rays, and phosphor layers formed in a predetermined pattern are excited by the ultraviolet rays to emit visible rays, and thus, an image is obtained.

FIG. 1 is a perspective view of an ear portion of a chassis 10, on which an exhaust pipe protecting tip is installed, used in a conventional plasma display module.

Referring to FIG. 1, the chassis 10 supporting a plasma display panel and a circuit board is rectangular in shape, and includes a chassis base 11, a first bending portion 12, a second bending portion 13, and an ear portion 14.

The ear portion 14 is formed at a corner of the chassis 10, and bosses 15 are formed on the ear portion 14 for fixing the chassis 10 onto a case (not shown).

Since the ear portion 14 extends from the chassis base 11 and there is no supporting unit for supporting the ear portion 14, a reinforcing material 20 is mounted on the ear portion 14 for reinforcing the ear portion 14.

In general, an exhaust pipe protecting tip 16 for protecting an exhaust pipe formed on a rear surface of the plasma display panel is formed on the ear portion 14, and the exhaust pipe protecting tip 16 is tube-shaped.

However, in the conventional structure illustrated in FIG. 1 for protecting the exhaust pipe, the exhaust pipe protecting tip 16 is forcibly inserted into the ear portion 14 of the chassis 10, but may be out of tolerance. First, a hole is formed in the ear portion 14 and the ear portion 14 is prepared for dying using a jig. Next, the exhaust pipe protecting tip 16 is placed into a hole of the ear portion 14, and a force is applied to the exhaust pipe protecting tip 16. In addition to the need for these operations, when assembling the plasma display module, the exhaust pipe protecting tip 16 may collide with the exhaust pipe, and the exhaust pipe may be damaged.

In addition, in order to perform the insertion process for forming the structure of the exhaust pipe protecting tip 16, the number of processes increases and fabrication costs rise. In addition, a predetermined space is required in order to perform the insertion process, and accordingly, the width of the ear portion 14 should be enlarged.

SUMMARY OF THE INVENTION

Aspects of the present invention provide an exhaust pipe protecting tip, which can protect an exhaust pipe and improve an ease of fabrication of the exhaust pipe protecting tip through separate fabrication of the exhaust pipe protecting tip including a guide and attachment of the exhaust pipe protecting tip to an ear portion of a chassis, and a plasma display module including the exhaust pipe protecting tip.

According to an aspect of the present invention, there is provided an exhaust pipe protecting tip for protecting an exhaust pipe of a plasma display module having a chassis with an ear portion and an exhaust hole for the exhaust pipe, the exhaust pipe protecting tip including: a protecting portion being cylindrically-shaped and to protect the exhaust pipe; a mounting portion formed on a side surface of the protecting portion, to fix the protecting portion to the ear portion of the chassis; and a guide protruding from an end of the protecting portion, to be inserted into the exhaust hole of the chassis.

The mounting portion may include a hole to receive the boss formed on the chassis, and the mounting portion is attached to the boss using a bolt.

The protecting portion, the mounting portion, and the guide may be integrally formed with each other.

The protecting portion, the mounting portion, and the guide may be formed of a plastic material.

The protecting portion, the mounting portion, and the guide may be formed using an injection molding method.

According to another aspect of the present invention, there is provided a plasma display module including: a plasma display panel displaying an image and including an exhaust pipe; a plurality of circuit boards driving the plasma display panel; a chassis supporting the plasma display panel and the circuit boards, and including an ear portion on the chassis, and an exhaust hole in which the exhaust pipe is inserted; and an exhaust pipe protecting tip including: a protecting portion being cylindrically-shaped and to protect the exhaust pipe, a mounting portion formed on a side surface of the protecting portion, to fix the protecting portion to the ear portion of the chassis, and a guide protruding from an end of the protecting portion, to be inserted into the exhaust hole of the chassis.

The ear portion may include a boss and the mounting portion may include a hole, the boss may be matched to the hole of the mounting portion, and the mounting portion may be attached to the boss using a bolt.

The protecting portion, the mounting portion, and the guide may be integrally formed with each other.

The protecting portion, the mounting portion, and the guide may be formed of a plastic material.

The protecting portion, the mounting portion, and the guide are formed using an injection molding method.

The module may further include a bead extending from a base of the chassis to the ear portion to reinforce the ear portion.

The bead may have a straight shape. At least a portion of the bead may be bent. In addition, a plurality of beads may be formed.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
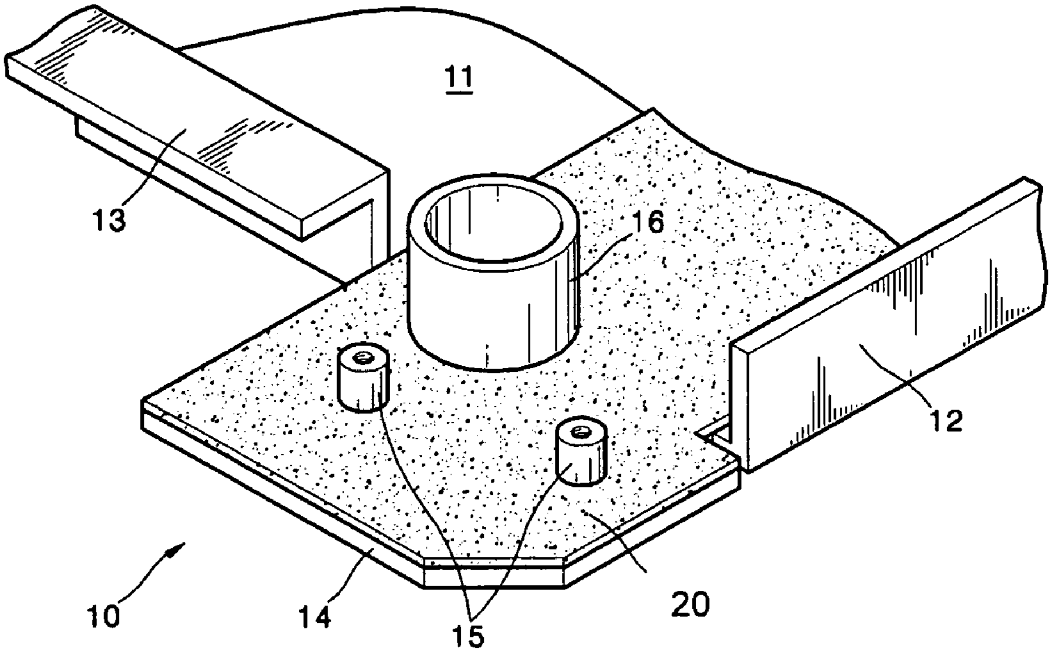
FIG. 1 (PRIOR ART)
FIG. 1 is a perspective view of an ear portion on which an exhaust pipe protecting tip is installed among ear portions of a chassis used in a plasma display module according to the conventional art.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
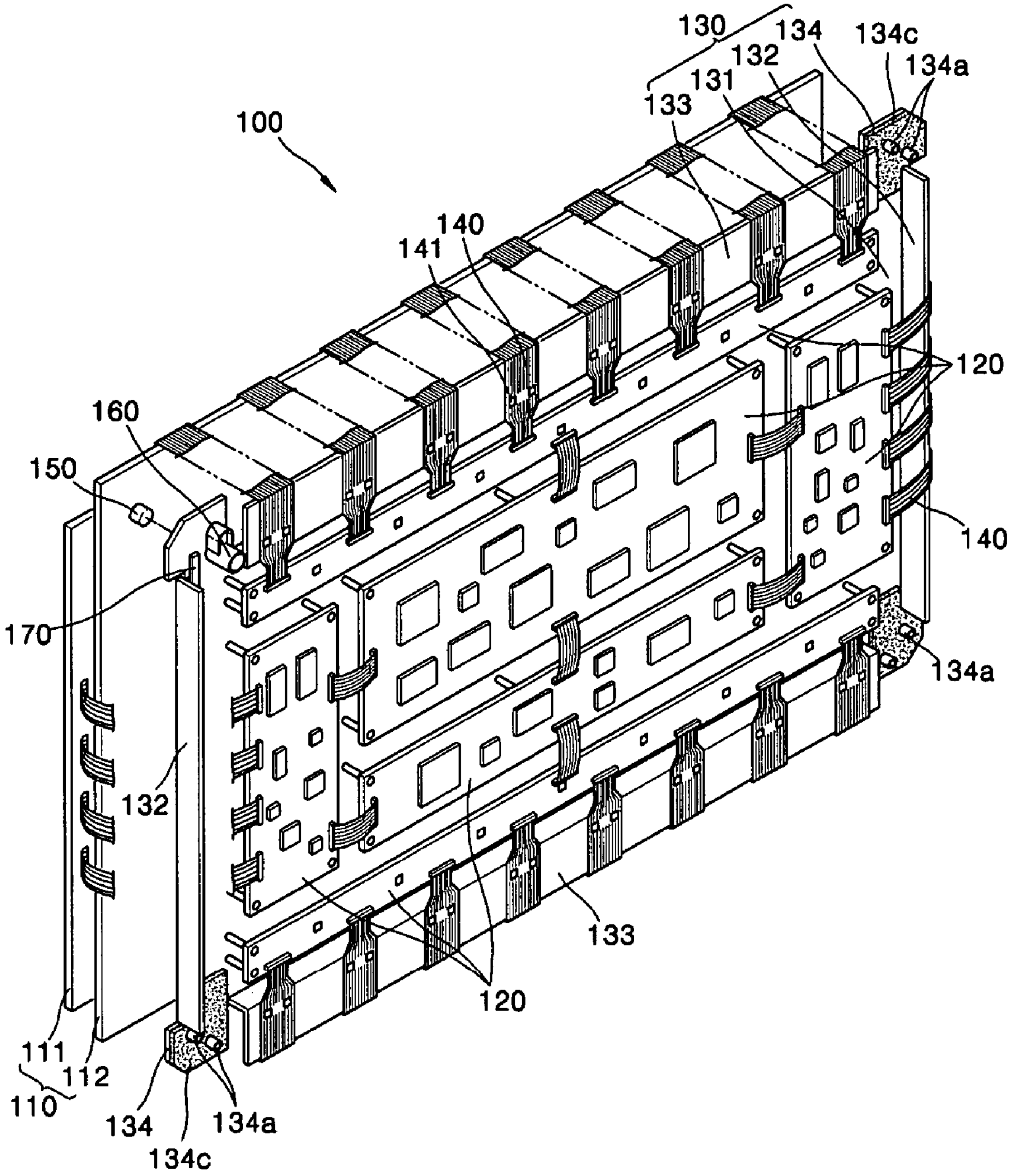
FIG. 2 is a schematic exploded perspective view of a plasma display module according to an embodiment of the present invention.
Figure 3:
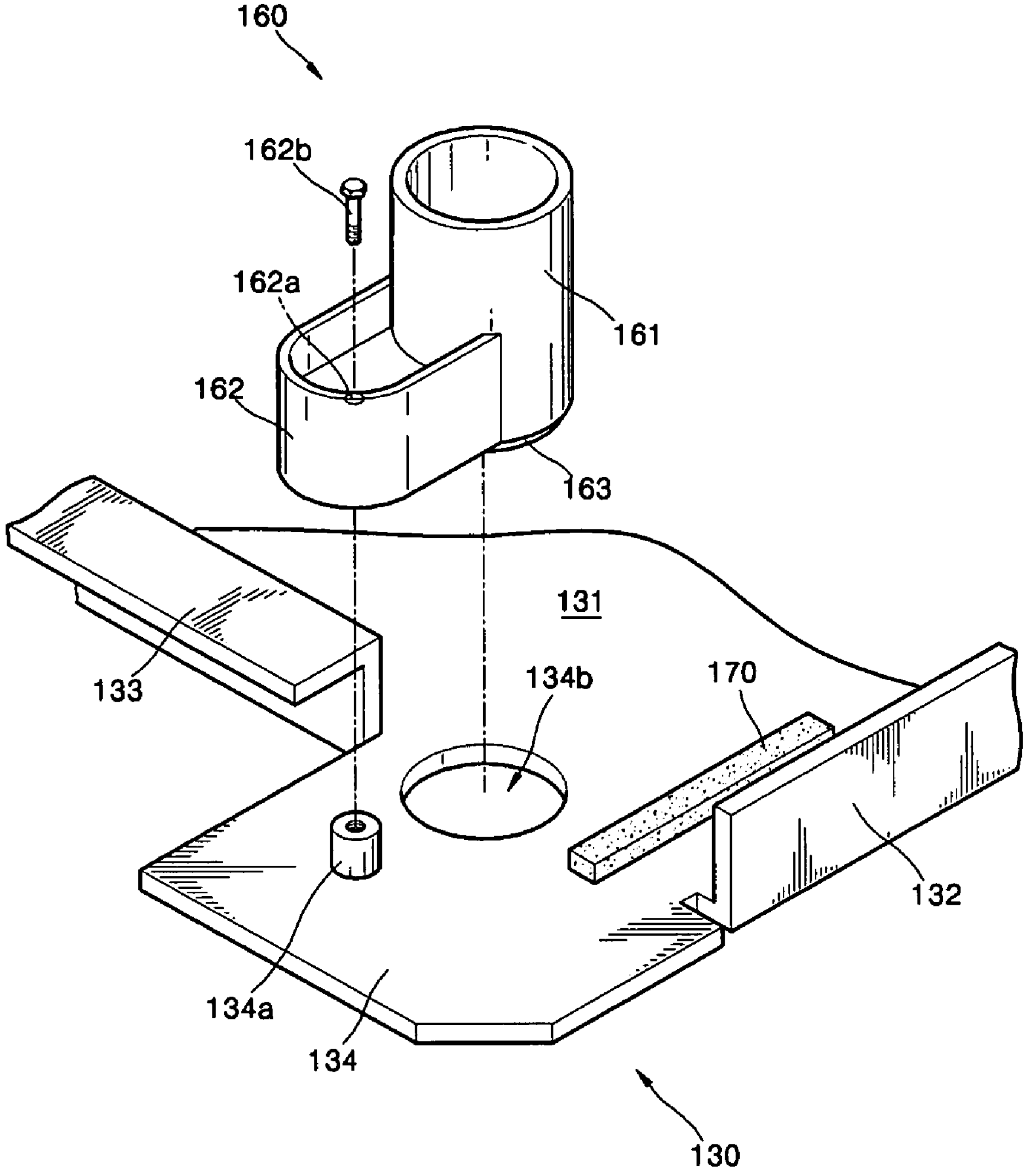
FIG. 3 is a perspective view of an ear portion at an upper left corner of a chassis of FIG. 2.

FIG. 2 is a schematic exploded perspective view of a plasma display module 100 according to an embodiment of the present invention, and FIG. 3 is a perspective view of an ear portion formed at an upper left corner of a chassis of FIG. 2.

Referring to FIG. 2, the plasma display module 100 according to an embodiment of the present invention includes a plasma display panel 110, a plurality of circuit boards 120 on which circuits for driving the plasma display panel 110 are disposed, and a chassis 130 supporting the plasma display panel 110 and the circuit boards 120.

The plasma display panel 110 which displays images, includes a front substrate 111 and a rear substrate 112 that are coupled to each other, and is electrically connected to the circuit boards 120 through signal transmission members 140. In addition, an exhaust pipe 150 is located at a rear surface of the rear substrate 112 (see upper left region of the rear substrate 112) for exhausting an impurity gas in the plasma display panel 110 after sealing the plasma display panel 110.

The chassis 130 includes a chassis base 131, first bending portions 132 at opposite sides of the chassis 130, second bending portions 133 at other opposite sides of the chassis 130, and ear portions 134 respectively extending from the chassis base 131 at the four corners of the chassis 130. The chassis 130 is generally formed of a metal such as aluminum using a casting method or a pressing method.

The plasma display panel 110 is fixed onto a front surface of the chassis base 131 to be supported by the chassis base 131, and the circuit boards 120 are supported by a rear surface of the chassis base 131. Besides the function of supporting the plasma display panel 110, the chassis base 131 receives heat generated by the plasma display panel 110 during operation and dissipates the heat to cool down the plasma display panel 110.

The first bending portions 132 reinforce the rigidity of the chassis 130, and protect the circuit boards 120 mounted on the chassis base 131 when assembling or moving the plasma display panel 110.

The second bending portions 133 also reinforce the rigidity of the chassis 130, and protect the circuit boards 120 mounted on the chassis base 131 when assembling or moving the plasma display panel 110. In addition, the second bending portions 133 support integrated circuit (IC) chips 141 formed on the signal transmission members 140 that transmit address signals, and dissipate heat from the IC chips 141.

Each of the ear portions 134 includes at least one boss 134*a*, and the bosses 134*a* are used to mount the chassis 130 in the case (not shown). The boss 134*a* on one of the ear portions 134 (see upper left portion of the chassis 130 in FIG. 2) is used to fix the exhaust pipe protecting tip 160.

In particular, referring to FIG. 3, the ear portion 134 formed on the upper left corner of the chassis 130 includes an exhaust hole 134*b* in which the exhaust pipe 150 is inserted.

Figure 4:
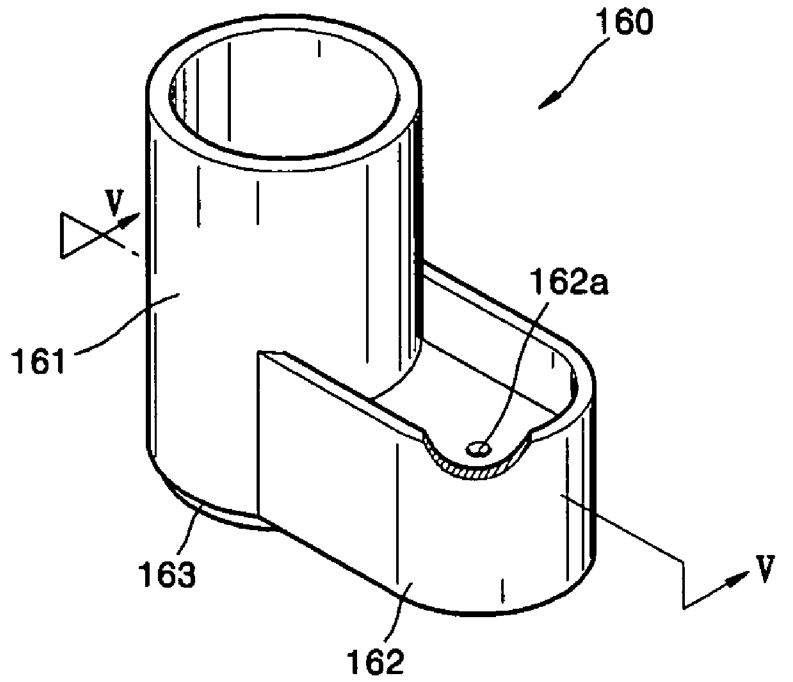
FIG. 4 is a perspective view of a structure of an exhaust pipe protecting tip according to an embodiment of the present invention.
Figure 5:
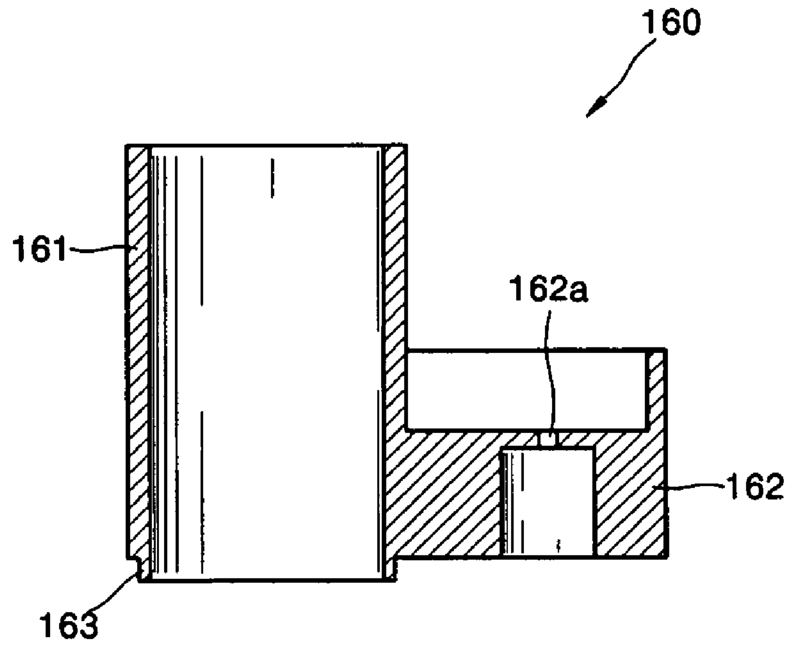
FIG. 5 is a cross-sectional view of the structure of the exhaust pipe protecting tip taken along line V-V of FIG. 4.

FIG. 4 is a perspective view of the exhaust pipe protecting tip 160 according to an embodiment of the present invention, and FIG. 5 is a cross-sectional view of the exhaust pipe protecting tip 160 taken along line V-V of FIG. 4.

Referring to FIGS. 3, 4, and 5, the exhaust pipe protecting tip 160 includes a protecting portion 161, a mounting portion 162, and a guide 163.

The protecting portion 161 is cylindrically-shaped with a hollow inner space. The exhaust pipe 150 is located inside the protecting portion 161 after assembling the plasma display module 100, and thus, the protecting portion 161 protects the exhaust pipe 150.

The mounting portion 162 is formed on a side portion of the protecting portion 161, and fixes the protecting portion 161 to the ear portion 134. That is, a hole 162*a* is formed in the mounting portion 162, and the hole 162*a* is matched to the boss 134*a* formed on the ear portion 134, and then, the mounting portion 162 is fixed to the boss 134*a* using a bolt 162*b*.

The guide 163 protrudes from an end portion of the protecting portion 161, and is inserted into the exhaust hole 134*b* formed on the ear portion 134 when the exhaust pipe protecting tip 160 is installed on the chassis 130.

The protecting portion 161, the mounting portion 162, and the guide 163 are formed of a plastic material, and they are integrally formed with each other using an injection molding method. That is, the exhaust pipe protecting tip 160 including the protecting portion 161, the mounting portion 162, and the guide 163 is formed using the injection molding method, and thus, fabrication time and the number of processes can be reduced.

According to aspects of the present embodiment, the protecting portion 161, the mounting portion 162, and the guide 163 are formed of a plastic material, however, they are not limited thereto, and can be formed of a metal or other non-metallic materials. Further, it is possible that these three elements are formed separately from each other and attached instead of being integrally formed.

When an operator assembles the plasma display module 100, he/she inserts the guide 163 into the exhaust hole 134*b*, and matches the hole 162*a* formed on the mounting portion 162 with the boss 134*a*, and then fixes them using the bolt 162. Therefore, the exhaust pipe protecting tip 160 can be fixed onto the ear portion 134 simply and firmly.

Meanwhile, referring to FIGS. 2 and 3, a bead 170 is formed on an upper left corner of the chassis 130, e.g., by pushing in a part of the chassis 130, so as to reinforce the strength of that ear portion 134, and reinforcing members

134*c* are additionally installed on other corners of the chassis 130 for reinforcing the strength of the other ear portions 134.

That is, according to an aspect of the present embodiment, the bead 170 is formed on the upper left corner of the chassis 130, and thus, there is no need to install the reinforcing member 134*c* on the upper left corner of the chassis 130. Therefore, the exhaust pipe protecting tip 160 can be installed easily.

A first end of the bead 170 formed on the upper left corner of the chassis 130 is located at that ear portion 134, and a second end of the bead 170 extends to the chassis base 131. In addition, according to an aspect of the present embodiment, the bead 170 is straight. However, the present invention is not limited to the above example, and if the bead 170 can reinforce the strength of that ear portion 134, the bead 170 can be positioned at any portion of the chassis 130 and can have various shapes such as a bent shape, a circular arc, or an oval shape.

A width of the bead 170 can be determined appropriately by a designer according to a degree of strength to be reinforced.

In addition, the bead 170 according to an aspect of the present embodiment is formed using a pressing process. However, it can be formed using other metal forming methods or casting methods.

The bead 170 protrudes from the rear surface of the chassis base 130 to be embossed so that the plasma display panel 110 can be installed easily since the plasma display panel 110 is located on the front surface of the chassis 130. However, the bead 170 is not limited to the above example, and the bead 170 can protrude from the front surface of the chassis base to be engraved if the bead 170 does not interfere with the installation of the plasma display panel 110.

In addition, a single bead 170 is formed on the upper left corner of the chassis 130, on which the exhaust pipe protecting tip 160 is mounted. However, a plurality of beads 170 may be formed in order to reinforce the strength of the ear portion 134.

Also, according to an aspect of the present embodiment, the bead 170 is only formed on the upper left corner of the chassis 130, on which the exhaust pipe protecting tip 160 is mounted. However, beads 170 can be formed on the other remaining corners of the chassis 130, thereby eliminating the need for the reinforcing members 134*c*.

As described above, according to aspects of the present embodiment, the exhaust pipe protecting tip 160 having the guide 163 formed of the plastic material is separately fabricated using an injection molding method, and after that, is mounted onto the ear portion 134 of the chassis 130. Therefore, there is no need to forcibly insert the exhaust pipe protecting tip 160, the number of processes can be reduced, and the time and costs for fabricating and installing the exhaust pipe protecting tip 160 can be reduced. In addition, the exhaust pipe protecting tip 160 can be located at an exact position, and thus, the exhaust pipe is not damaged during the assembling processes.

Also, the bead 170 can be formed on a side portion of the exhaust pipe protecting tip 160, and thus the ear portion 134 on which the exhaust pipe protecting tip 160 is mounted can be reinforced simply and efficiently without using an additional reinforcing member.

According to aspects of the present invention, the exhaust pipe protecting tip including the guide is separately fabricated and mounted on the ear portion of the chassis, and thus, the exhaust pipe can be protected and the exhaust pipe protecting tip can be installed efficiently.

That is, when the exhaust pipe protecting tip is installed according to aspects of the present invention, a process of forcibly inserting the exhaust pipe protecting tip into the corresponding ear portion is not necessary or performed, and thus, the number of processes is reduced and the fabrication costs can be reduced. Therefore, the exhaust pipe protecting tip can be installed at an exact position, and thus, the exhaust pipe is not damaged during the assembling processes.

In addition, an essential space required to perform the forcible insertion process is not required according to aspects of the present invention, and thus, the width of the ear portion can be controlled appropriately and the remaining space of the chassis can be more efficiently utilized.

According to aspects of the present invention, a process of forming an additional reinforcing member for reinforcing the ear portion of the chassis on which the exhaust pipe protecting tip is installed is not required, and the ear portion can be reinforced by forming the bead using a simple method such as a pressing method. Therefore, the number of processes for fabricating the ear portion can be reduced, and thus, time and costs taken to fabricate the chassis can be reduced.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An exhaust pipe protecting tip for protecting an exhaust pipe of a plasma display module having a chassis with an ear portion and an exhaust hole for the exhaust pipe, the exhaust pipe protecting tip comprising:

a protecting portion being cylindrically-shaped and to protect the exhaust pipe;

a mounting portion formed on a side surface of the protecting portion, to fix the protecting portion to the ear portion of the chassis; and a guide protruding from an end of the protecting portion, to be inserted into the exhaust hole of the chassis.

2. The exhaust pipe protecting tip of claim 1, wherein the ear portion has a boss, wherein:

the mounting portion includes a hole to receive the boss formed on the chassis, and the mounting portion is attached to the boss using a bolt.

3. The exhaust pipe protecting tip of claim 1, wherein the protecting portion, the mounting portion, and the guide are integrally formed with each other.

4. The exhaust pipe protecting tip of claim 1, wherein the protecting portion, the mounting portion, and the guide are formed of a plastic material.

5. The exhaust pipe protecting tip of claim 1, wherein the protecting portion, the mounting portion, and the guide are formed using an injection molding method.

6. The exhaust pipe protecting tip of claim 1, wherein the protecting portion, the mounting portion, and the guide are formed of a metallic material.

7. A plasma display module comprising:

a plasma display panel displaying an image and including an exhaust pipe;

a plurality of circuit boards driving the plasma display panel;

a chassis supporting the plasma display panel and the circuit boards, and including an ear portion on the chassis, and an exhaust hole in which the exhaust pipe is inserted; and a chassis supporting the plasma display panel and the circuit boards, and including an ear portion on the chassis, and an exhaust hole in which the exhaust pipe is inserted; and an exhaust pipe protecting tip comprising:

a protecting portion being cylindrically-shaped and to protect the exhaust pipe, a mounting portion formed on a side surface of the protecting portion, to fix the protecting portion to the ear portion of the chassis, and a guide protruding from an end of the protecting portion, to be inserted into the exhaust hole of the chassis.

8. The plasma display module of claim 7, wherein the ear portion includes a boss and the mounting portion includes a hole, the boss is matched to the hole of the mounting portion, and the mounting portion is attached to the boss using a bolt.

9. The plasma display module of claim 7, wherein the protecting portion, the mounting portion, and the guide are integrally formed with each other.

10. The plasma display module of claim 7, wherein the protecting portion, the mounting portion, and the guide are formed of a plastic material.

11. The plasma display module of claim 7, wherein the protecting portion, the mounting portion, and the guide are formed using an injection molding method.

12. The plasma display module of claim 7, further comprising:

a bead extending from a base of the chassis to the ear portion to reinforce the ear portion.

13. The plasma display module of claim 12, wherein the bead has a straight shape.

14. The plasma display module of claim 12, wherein at least a portion of the bead is bent.

15. The plasma display module of claim 12, wherein a plurality of beads extend from the base to the ear portion to reinforce the ear portion.

16. The plasma display module of claim 7, wherein the protecting portion, the mounting portion, and the guide are formed of a metallic material.

17. The plasma display module of claim 12, wherein the bead is at or near a side of the exhaust pipe protecting tip and on a same surface of the chassis as the exhaust pipe protecting tip.

* * * * *

UNITED STATES PATENT AND TRADEMARK OFFICE

CERTIFICATE OF CORRECTION

PATENT NO. : 7,433,180 B2 
APPLICATION NO. : 11/342878
DATED : October 7, 2008
INVENTOR(S) : Joong-Ha Ahn et al.

It is certified that error appears in the above-identified patent and that said Letters Patent is hereby corrected as shown below:

Column 7, lines 1-4, delete “a chassis supporting the plasma display panel and the circuit boards, and including an ear portion on the chassis, and an exhaust hole in which the exhaust pipe is inserted; and”.

Signed and Sealed this

Second Day of December, 2008

Jon W. Dudas

JON W. DUDAS
*Director of the United States Patent and Trademark Office*